(12) United States Patent
Tsai et al.

(10) Patent No.: US 9,190,558 B2
(45) Date of Patent: Nov. 17, 2015

(54) DISPLAY DEVICE AND DISPLAY PANEL WITH LARGE APERTURE RATIO OF PIXELS THEREOF

(71) Applicant: INNOLUX CORPORATION, Chu-Nan, Miao-Li County (TW)

(72) Inventors: Chia-Hao Tsai, Chu-Nan (TW); Chih-Lung Lin, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 125 days.

(21) Appl. No.: 13/938,567

(22) Filed: Jul. 10, 2013

(65) Prior Publication Data

US 2014/0014961 A1    Jan. 16, 2014

(30) Foreign Application Priority Data

Jul. 13, 2012   (TW) .............................. 101125281 A

(51) Int. Cl.
| | |
|---|---|
| H01L 29/04 | (2006.01) |
| H01L 33/00 | (2010.01) |
| H01L 51/52 | (2006.01) |
| H01L 27/32 | (2006.01) |
| G02F 1/1362 | (2006.01) |
| H01L 29/786 | (2006.01) |

(52) U.S. Cl.
CPC ...... *H01L 33/0041* (2013.01); *G02F 1/136286* (2013.01); *H01L 27/3276* (2013.01); *H01L 51/5284* (2013.01); *G02F 2001/136222* (2013.01); *H01L 29/7869* (2013.01)

(58) Field of Classification Search
CPC ........................... H01L 27/1214; H01L 27/12
USPC ........................................ 257/59, 72; 438/149
See application file for complete search history.

(56) References Cited

U.S. PATENT DOCUMENTS

2005/0195150 A1* 9/2005 Etoh et al. ...................... 345/100
2006/0279524 A1* 12/2006 Huang et al. .................. 345/103

FOREIGN PATENT DOCUMENTS

| CN | 102338953 | 2/2012 |
| TW | 401528 | 8/2000 |
| TW | I321239 | 3/2010 |
| TW | 201142419 | 12/2011 |
| TW | 201200935 | 1/2012 |

OTHER PUBLICATIONS

Kamiya et al., "Present Status of Amorphous In-Ga-Zn-O Thin-Film Transistors", Science & Technology of Advanced Materials 11 (2010) 044305, pp. 1-23.
Office Action dated Jan. 8, 2015, issued by Taiwan Intellectual Property Office.

* cited by examiner

*Primary Examiner* — Jami M Valentine
(74) *Attorney, Agent, or Firm* — Liu & Liu

(57) ABSTRACT

A display device and a display panel thereof are provided. The display panel includes a plurality of pixels, a first adjacent zone and a plurality of gate lines. The pixels include a first pixel and a second pixel adjacent to the first pixel. Each pixel includes one of the gate lines. The gate lines include a first gate line and a second gate line. The first pixel includes the first gate line. The second pixel includes the second gate line. The first gate line and the second gate line are located at the first adjacent zone.

20 Claims, 6 Drawing Sheets

DISPLAY DEVICE AND DISPLAY PANEL WITH LARGE APERTURE RATIO OF PIXELS THEREOF

This application claims the benefit of Taiwan application Ser. No. 101125281, filed Jul. 13, 2012, the subject matter of which is incorporated herein by reference.

BACKGROUND OF THE INVENTION

1. Field of the Invention

The invention relates in general to an electronic device and its elements, and more particularly to a display device and a display panel thereof.

2. Description of the Related Art

Along with the advance in the display technology, various display panels are constantly invented and provided. For example, the liquid crystal the display panel, the plasma display panel and the organic light emitting diode display panel have replaced the conventional cathode ray picture tube (CRT) display.

In the structure of a display panel, pixel is the smallest display unit. Each pixel displays one single color. By controlling the grey level of the color of each pixel, a colorful frame formed by pixels can thus be presented.

SUMMARY OF THE INVENTION

The invention is directed to a display device and a display panel thereof. Through the design of the gate lines being located at the same adjacent zone of two pixels, the aperture ratio of the pixel can thus be increased.

According to an embodiment of the present invention, a display panel is provided. The display panel includes several pixels and several gate lines. The pixels include a first pixel and a second pixel adjacent to the first pixel. Each pixel corresponds to one of the gate lines. The gate lines include a first gate line and a second gate line. The first gate line corresponds to the first pixel. The second gate line corresponds to the second pixel. The first gate line and the second gate line are located at the same adjacent zone of the first pixel and the second pixel.

According to another embodiment of the present invention, a display device is provided. The display device includes a display panel and a driving circuit board. The display panel includes several pixels and several gate lines. The pixels include a first pixel and a second pixel adjacent to the first pixel. Each pixel corresponds to one of the gate lines. The gate lines include a first gate line and a second gate line. The first gate line corresponds to the first pixel. The second gate line corresponds to the second pixel. The first gate line and the second gate line are located at the same adjacent zone of the first pixel and the second pixel. The driving circuit board is used for driving the display panel.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of embodiments are disclosed below for elaborating the invention. However, the embodiments of the invention are for detailed descriptions only, not for limiting the scope of protection of the invention. Furthermore, secondary or unimportant elements are omitted in the accompanying diagrams of the embodiments for highlighting the technical features of the invention.

First Embodiment

Figure 1:
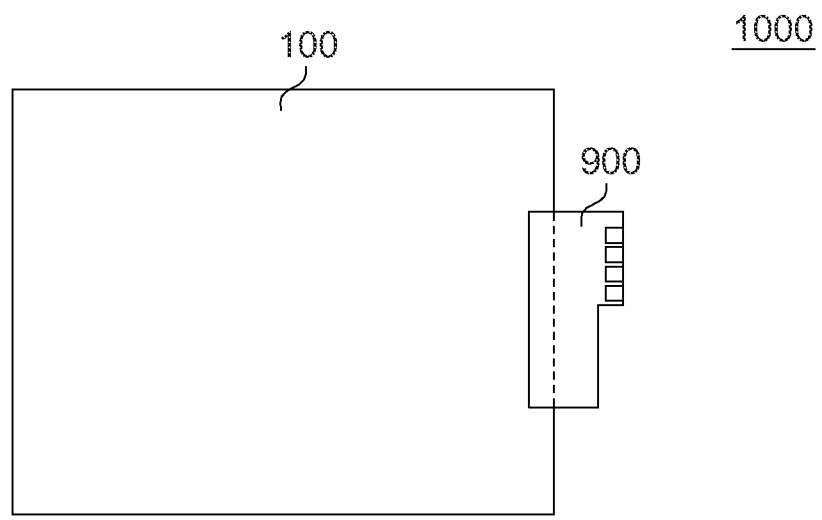
FIG. 1 shows a schematic diagram of a display device of a first embodiment.

Referring to FIG. 1, a schematic diagram of a display device 1000 of a first embodiment. The display device 1000 includes a display panel 100 and a driving circuit board 900. The display panel 100 is used for displaying various frames, and can be realized by such as a liquid crystal display panel, an organic light emitting diode display panel or an electronic paper display panel. The driving circuit board 900 is used for driving the display panel 100, and is realized by such as a hard circuit board or a flexible circuit board.

Figure 2:
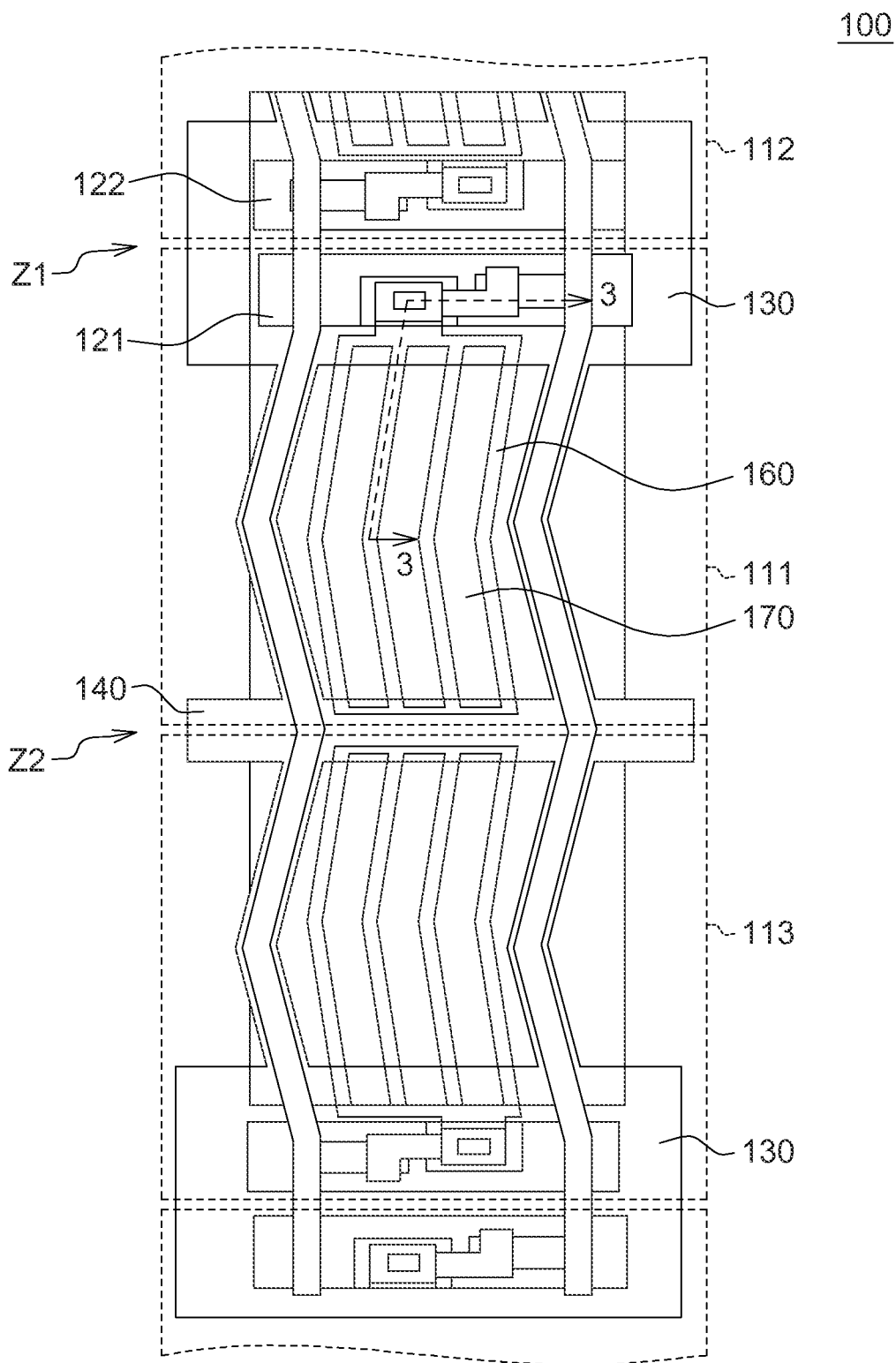
FIG. 2 shows a schematic diagram of partial pixels of a display panel of FIG. 1.

Referring to FIG. 2, a schematic diagram of partial pixels of a display panel 1000 of FIG. 1 is shown. The display panel 100 includes several pixels (such as a first pixel 111, a second pixel 112 and a third pixel 113), several gate lines (such as a first gate line 121 and a second gate line 122) and several light-shielding blocks 130. Pixel is the smallest display unit for displaying a frame. Each pixel displays a color, and includes one of the gate lines. Each gate line is used for driving one single pixel. The driving circuit board 900 (illustrated in FIG. 1) controls each gate line and further controls the grey level of the color of each pixel, so that a colorful frame formed by pixels can thus be presented. The light-shielding blocks 130 are used for shielding partial elements to avoid an external light affecting the efficiency of partial elements or avoid the elements being seen by the viewers. The light-shielding blocks 130 can be a black matrix.

When the display panel 100 is formed by a material susceptible to the influence of the light (the material can be indium gallium zinc oxide (IGZO)), the shielding range of the light-shielding blocks 130 must be slightly larger than the area of the material to avoid the light being radiated by an angle beam of the light.

As indicated in FIG. 2, the pixels can include the first pixel 111 and the second pixel 112 adjacent to the first pixel. The gate lines can include a first gate line 121 and a second gate line 122, wherein the first gate line 121 and the second gate line 122 are driven at different time. The first pixel 111 includes the first gate line 121, and the second pixel 112 includes the second gate line 122. The first gate line 121 and the second gate line 122 are located at the first adjacent zone Z1 between the first pixel 111 and the second pixel 112. When the material susceptible to the influence of the light is used in the vicinity of the first gate line 121 and the second gate line 122, the first gate line 121 and the second gate line 122 must be shielded by the light-shielding blocks 130. In the present embodiment, since the first gate line 121 and the second gate line 122 are located at the first adjacent zone Z1, the light-shielding blocks 130 only need to be disposed at the first adjacent zone Z1 for shielding the first gate line 121 and the second gate line 122.

Moreover, since the first gate line 121 and the second gate line 122 are located at the same adjacent zone, the additional range required by the light-shielding blocks 130 for shielding the first gate line 121 overlaps the additional range required by the light-shielding blocks 130 for shielding the second gate line 122, and the aperture ratio of the first pixel 111 and the second pixel 112 is thus increased.

Referring to FIG. 2, the pixels can further include a third pixel 113. The second pixel 112 and the third pixel 113 are respectively disposed on two opposite sides of the first pixel 111. The display panel 100 further includes several light-shielding bars 140. One of the light-shielding bars 140 is disposed at the second adjacent zone Z2 between the first pixel 111 and the third pixel 113. The area of the light-shielding bars 140 is smaller than the area of the light-shielding blocks 130. For example, the area of the light-shielding bars 140 is 1/20 to 9/10 of the area of the light-shielding blocks 130. Preferably, the area of the light-shielding bars 140 is 1/6 to 1/2 of the area of the light-shielding blocks 130. Since the first gate line 121 and the second gate line 122 are located at the first adjacent zone Z1, the second adjacent zone Z2 disposed between the first pixel 111 and the third pixel 113 does not have any gate lines. Under such circumstances, the area of the light-shielding bars 140 located in the second adjacent zone Z2 does not need to be large.

Figure 3:
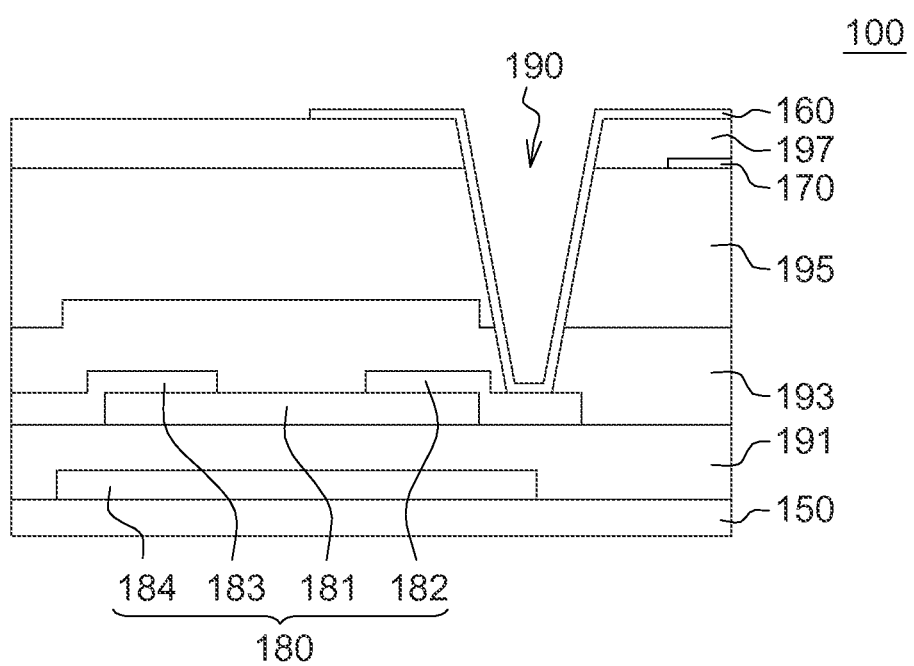
FIG. 3 shows a cross-sectional view of a display panel of FIG. 2 along a cross-sectional line 3-3.

Referring to FIG. 3, a cross-sectional view of a display panel 100 of FIG. 2 along a cross-sectional line 3-3 is shown. The display panel 100 further includes a substrate 150, several pixel electrodes 160 (FIG. 3 only illustrates one pixel electrode 160), a common electrode 170 (FIG. 3 only illustrates one the common electrode 170) and several thin film transistors 180 (FIG. 3 only illustrates one thin film transistor 180). Each pixel electrode 160 corresponds to one of the pixels. Each pixel corresponds to one of the thin film transistors 180. Each pixel electrode 160 and the common electrode 170 are located at the substrate 150, and each pixel electrode 160 is disposed on the common electrode 170.

Each thin film transistor 180 includes an active layer 181, a source 182, a drain 183 and a gate 184. The gate 184 is a portion of the first gate line 121 (illustrated in FIG. 2). The gate 184 is disposed under the active layer 181, which is disposed between the source 182 and the drain 183. In another embodiment, the position of the source 182 and the position of the drain 183 are exchangeable. Each active layer 181 is formed by amorphous silicon, polycrystalline silicon or an oxide semiconductor such as indium gallium zinc oxide (IGZO). Through the driving by the gate 184, the active layer 181 can form a channel for conducting the thin film transistors 180.

In the present embodiment, each pixel electrode 160 is electrically connected to an active layer 181 through a conductive through hole 190. Since the conductive through hole 190 is disposed on the extension of the source 182, the conductive through hole 190 is located outside the active layer 181, not on the active layer 181, hence reducing the area of the source 182 on the gate 184. That is, the coupling capacitance between the source 182 and the gate 184 is reduced, and the electrical efficiency is thus increased.

Referring to FIG. 3, the display panel 100 further includes a first insulating layer 191, a second insulating layer 193, a third insulating layer 195 and a fourth insulating layer 197. The four insulating layers can be formed by an inorganic or an organic material. Preferably, the first insulating layer 191, the second insulating layer 193 and the fourth insulating layer 197 are formed by an inorganic material, and the third insulating layer is formed by an organic material.

Second Embodiment

Figure 4:
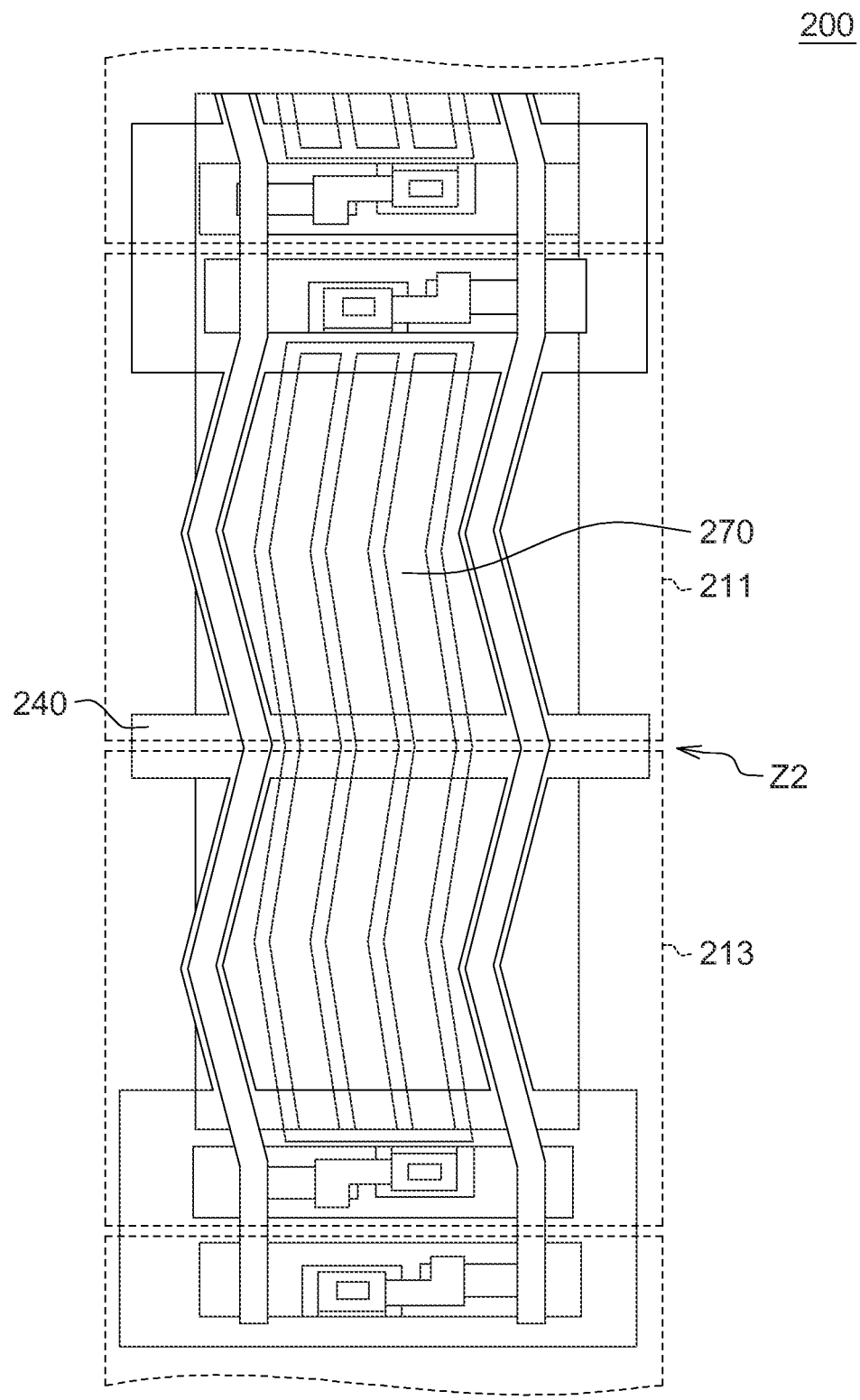
FIG. 4 shows a schematic diagram of partial pixels of a display panel of a second embodiment.

Referring to FIG. 4, a schematic diagram of partial pixels of a display panel 200 of a second embodiment is shown. The display panel 200 of the present embodiment is different from the display panel 100 of the first embodiment in that the light-shielding bars 140 of the first embodiment (illustrated in FIG. 2) are replaced with the auxiliary metal layers 240, and other similarities are not repeated here.

Referring to FIG. 4, one of the auxiliary metal layers 240 is located at the second adjacent zone Z2 between the first pixel 211 and the third pixel 213. The auxiliary metal layers 240 are electrically connected to the common electrode 270 for boosting the driving power of the common electrode 270. Also, the auxiliary metal layers 240 provide light-shielding function. The area of the auxiliary metal layers 240 is smaller than the area of the light-shielding blocks. For example, the area of the auxiliary metal layers 240 is 1/20 to 9/10 of the area of the light-shielding blocks. Preferably, the area of the auxiliary metal layers 240 1/6 to 1/2 of the area of the light-shielding blocks.

Third Embodiment

Figure 5:
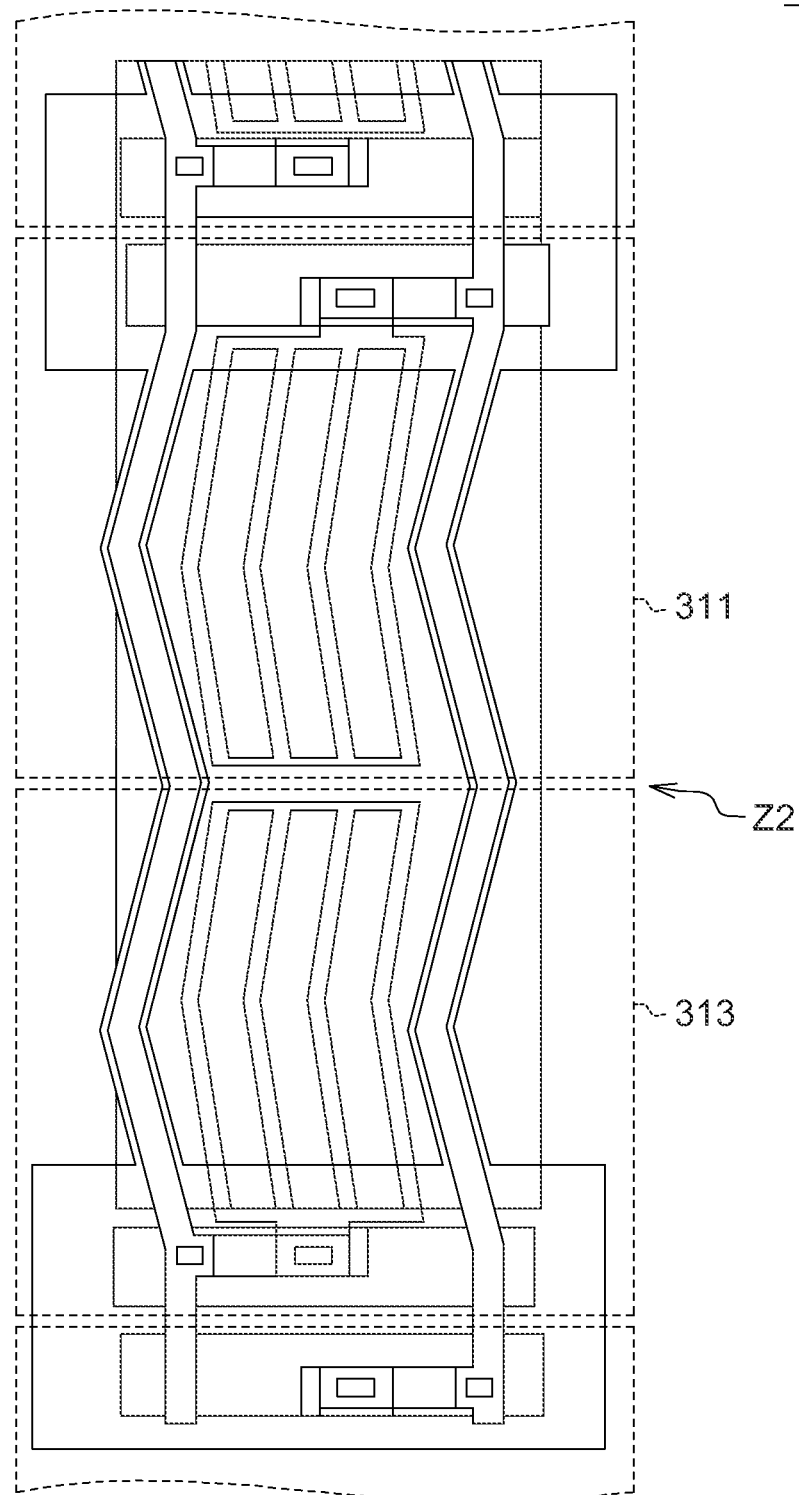
FIG. 5 shows a schematic diagram of partial pixels of a display panel of a third embodiment.

Referring to FIG. 5, a schematic diagram of partial pixels of a display panel 300 of a third embodiment is shown. The display panel 300 of the present embodiment is different from the display panel 100 of the first embodiment or the display panel 200 of the second embodiment in that the second adjacent zone Z2 between the first pixel 311 and the third pixel 313 does not have any light-shielding bars or auxiliary metal layers in the present embodiment, and other similarities are note repeated here.

Referring to FIG. 5, in some embodiments, such as in-plane switching (IPS) display panel and fringe field switching (FFS) display panel, the liquid crystal arrangement direction of the electric field remains the same, that is, a dark belt, no matter the junction between the first pixel 311 and the third pixel 313 receives a voltage or not, and there is no need for the disposition of the light-shielding bars or the auxiliary metal layers. Similarly, the implementation of the present embodiment, in which no light-shielding bars or auxiliary metal layers are disposed, is also applicable to the above design of the first embodiment.

Fourth Embodiment

Figure 6:
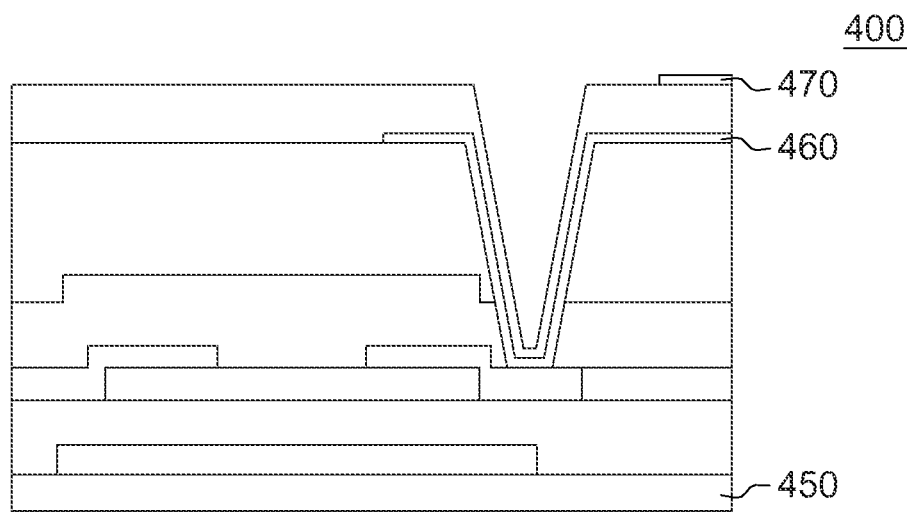
FIG. 6 shows a schematic diagram of partial pixels of a display panel of a fourth embodiment.

Referring to FIG. 6, a schematic diagram of partial pixels of a display panel 400 of a fourth embodiment is shown. The display panel 400 of the present embodiment is different from the display panel 100 of the first embodiment in that the disposition relationship between the pixel electrode 460 and the common electrode 470, and other similarities are not repeated here.

In the present embodiment, each pixel electrode 460 and the common electrode 470 are disposed on the substrate 450, and the common electrode 470 is disposed on each pixel electrode 460. Similarly, the implementation of the common electrode 470 and pixel electrode 460 of the present embodiment is also applicable to the above design of the first embodiment.

Fifth Embodiment

Figure 7:
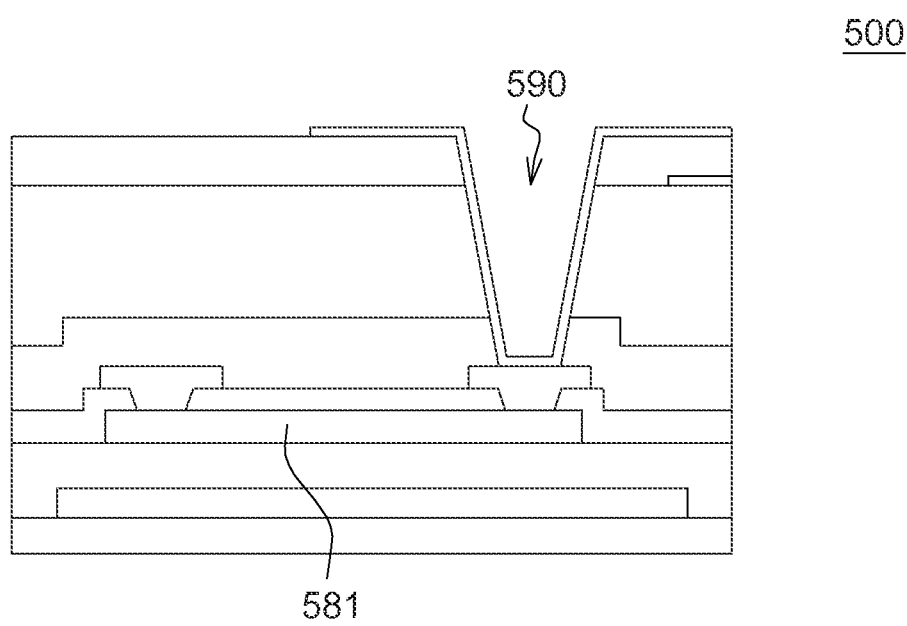
FIG. 7 shows a schematic diagram of partial pixels of a display panel of a fifth embodiment.

Referring to FIG. 7, a schematic diagram of partial pixels of a display panel 500 of a fifth embodiment is shown. The display panel 500 of the present embodiment is different from the display panel 100 of the first embodiment in the disposition of the conductive through hole 590, and other similarities are not repeated here.

In the present embodiment, each conductive through hole 590 is disposed on each active layer 581. Similarly, the implementation of the conductive through hole 590 of the present embodiment is also applicable to the above design of the first embodiment.

Although the invention is exemplified by the first to the fifth embodiment, the implementations of the invention are not limited thereto. In terms of "the junction between first pixel and second pixel", the designer can select from at least three implementations such as the first embodiment, the second embodiment and the third embodiment. In terms of "the disposition relationship between pixel electrode and common electrode", the designer can select from at least two implementations such as the first embodiment and the fourth embodiment. In terms of "the disposition of conductive through hole", the designer can select from at least two implementations such as the first embodiment and the fifth embodiment. The at least three implementations of "the junction between first pixel and second pixel", the at least two implementations of "the disposition relationship between pixel electrode and the common electrode" and the at least two implementations of "the disposition of conductive through hole" together can have 12 combinations of implementations (3*2*2=12).

The present invention can be used in various display panels such as in plane switching (IPS) display panel, fringe field switching (FFS) display panel, twisted nematic (TN) display panel, vertical alignment (VA) display panel, optical compensation banded (OCB) display panel or blue phase display panel.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
   a plurality of pixels, comprising:
   a first pixel; and
   a second pixel adjacent to the first pixel;
   a first adjacent zone located between the first pixel and the second pixel; and
   a plurality of gate lines, wherein each pixel comprises one of the gate lines, and the gate lines comprise:
   a first gate line, wherein the first pixel comprises the first gate line; and
   a second gate line, wherein the second pixel comprises the second gate line, the first gate line and the second gate line are located at the first adjacent zone, and the first gate line and the second gate line are driven at different time.

2. The display panel according to claim 1, further comprising:
   a plurality of light-shielding blocks, wherein one of the light-shielding blocks is disposed at the first adjacent zone to shield the first gate line and the second gate line.

3. The display panel according to claim 2, wherein the pixels further comprise a third pixel, and the second pixel and the third pixel are respectively disposed on two opposite sides of the first pixel; and
   wherein the display panel further comprises:
   a second adjacent zone located between the first pixel and the third pixel; and
   a plurality of light-shielding bars, wherein one of the light-shielding bars is disposed at the second adjacent zone.

4. The display panel according to claim 3, wherein an area of the light-shielding bars is smaller than that of the light-shielding blocks.

5. The display panel according to claim 3, wherein an area of the light-shielding bars is 1/20 to 9/10 of that of the light-shielding blocks.

6. The display panel according to claim 2, wherein the pixels further comprise a third pixel, and the second pixel and the third pixel are respectively disposed on two opposite sides of the first pixel; and
   wherein the display panel further comprises:
   a second adjacent zone located between the first pixel and the third pixel; and
   a plurality of auxiliary metal layers, wherein one of the auxiliary metal layers is disposed at the second adjacent zone.

7. The display panel according to claim 6, wherein an area of the auxiliary metal layers is smaller than that of the light-shielding blocks.

8. The display panel according to claim 6, wherein an area of the auxiliary metal layers is 1/20 to 9/10 of that of the light-shielding blocks.

9. The display panel according to claim 2, further comprising:
   a plurality of thin film transistors, wherein each pixel corresponds to one of the thin film transistors, and each thin film transistor comprises an active layer formed by amorphous silicon, polycrystalline silicon or oxide semiconductor.

10. The display panel according to claim 9, further comprising:
    a plurality of pixel electrodes, each being corresponding to one of the pixels and electrically connected to each active layer through a conductive through hole located outside each active layer.

11. The display panel according to claim 9, further comprising:
    a plurality of pixel electrodes, each pixel electrode being corresponding to one of the pixels and electrically connected to each active layer through a conductive through hole located on each active layer.

12. A display device, comprising:
    a display panel, including:
    a plurality of pixels, comprising:
    a first pixel; and
    a second pixel adjacent to the first pixel;
    a first adjacent zone located between the first pixel and the second pixel; and
    a plurality of gate lines, wherein each pixel comprises one of the gate lines, and the gate lines comprise:
    a first gate line, wherein the first pixel comprises the first gate line; and
    a second gate line, wherein the second pixel comprises the second gate line, the first gate line and the second gate line are located at the first adjacent zone, and the first gate line and the second gate line are driven at different time; and
    a driving circuit board, used for driving the display panel.

13. The display device according to claim 12, wherein the display panel further comprises:
    a plurality of light-shielding blocks, wherein one of the light-shielding blocks is disposed at the first adjacent zone to shield the first gate line and the second gate line.

14. The display device according to claim 13, wherein the pixels further comprise a third pixel, and the second pixel and the third pixel are respectively disposed on two opposite sides of the first pixel; and wherein the display panel further comprises:
a second adjacent zone located between the first pixel and the third pixel; and
a plurality of light-shielding bars, wherein one of the light-shielding bars is disposed at the second adjacent zone.

15. The display panel according to claim 14, wherein the area of the light-shielding bars is smaller than the area of the light-shielding blocks.

16. The display device according to claim 13, wherein the pixels further comprises a third pixel, and the second pixel and the third pixel are respectively disposed on two opposite sides of the first pixel; and
wherein the display panel further comprises:
a second adjacent zone located between the first pixel and the third pixel; and
a plurality of auxiliary metal layers, wherein one of the auxiliary metal layers is disposed at the second adjacent zone.

17. The display panel according to claim 16, wherein the area of the auxiliary metal layers is smaller than the area of the light-shielding blocks.

18. The display device according to claim 13, wherein the display panel further comprises:
a plurality of thin film transistors, wherein each pixel corresponds to one of the thin film transistors, and each thin film transistor comprises an active layer formed by amorphous silicon, polycrystalline silicon or an oxide semiconductor.

19. The display device according to claim 18, wherein the display panel further comprises:
a plurality of pixel electrodes, each being corresponding to one of the pixels and electrically connected to each active layer through a conductive through hole located outside each active layer.

20. The display device according to claim 18, wherein the display panel further comprises:
a plurality of pixel electrodes, each being corresponding to one of the pixels and electrically connected to each active layer through a conductive through hole located on each active layer.

* * * * *